(12) United States Patent
Karandikar et al.

(10) Patent No.: US 7,270,885 B1
(45) Date of Patent: Sep. 18, 2007

(54) METHOD FOR BRAZING CERAMIC-CONTAINING BODIES, AND ARTICLES MADE THEREBY

(76) Inventors: Prashant G. Karandikar, 113 Cypress Point, Avondale, PA (US) 19311; Barry R. Rossing, deceased, late of Ocean Pines, MD (US); by Marlene Rossing, legal representative, 6 Bunker Ct., Ocean Pines, MD (US) 21811

( * ) Notice: Subject to any disclaimer, the term of this patent is extended or adjusted under 35 U.S.C. 154(b) by 466 days.

(21) Appl. No.: 10/990,279

(22) Filed: Nov. 15, 2004

Related U.S. Application Data

(63) Continuation-in-part of application No. 10/294,454, filed on Nov. 14, 2002, now Pat. No. 6,884,511.

(60) Provisional application No. 60/523,857, filed on Nov. 20, 2003, provisional application No. 60/332,816, filed on Nov. 14, 2001.

(51) Int. Cl.
*B32B 9/00* (2006.01)
(52) U.S. Cl. .................. 428/446; 428/448; 428/698
(58) Field of Classification Search ................ 428/446, 428/448, 698
See application file for complete search history.

(56) References Cited

U.S. PATENT DOCUMENTS 4,602,731 A * 7/1986 Dockus ...................... 228/121
5,564,066 A * 10/1996 Abiven ....................... 428/549
5,965,193 A * 10/1999 Ning et al. ............... 427/126.4
6,033,787 A * 3/2000 Nagase et al. .............. 428/545
6,413,589 B1* 7/2002 Li ............................ 427/376.6
6,426,154 B1* 7/2002 Naba et al. ................. 428/620

* cited by examiner

*Primary Examiner*—Jennifer McNeil
*Assistant Examiner*—Jonathan Langman
(74) *Attorney, Agent, or Firm*—Law Office of Jeffrey R. Ramberg

(57) ABSTRACT

Ceramic-containing bodies can be bonded to other ceramic-containing bodies, or to metals or metal-containing bodies, by way of an aluminum-silicon brazing alloy. Such alloys feature high thermal conductivity and a melting range intermediate to Cu—Sil and Au—Si. By metallizing the surface of an aluminum- or silicon-containing ceramic body, for example, with silicon or aluminum, the formation of deleterious intermetallic phases at the brazing interface is avoided. This technique is particularly useful for joining reaction-bonded silicon carbide (RBSC) composite bodies, and particularly such composite bodies that contain appreciable amounts of aluminum as a metallurgical modification of the residual silicon phase. Interestingly, when the RBSC body contains minor amounts of the aluminum alloying constituent, or none, the metallization layer is not required. The resulting bonded structures have utility as mirrors, as packaging for electronics, and in semiconductor lithography equipment, e.g., as electrostatic chucks for supporting a silicon wafer during the lithography process.

14 Claims, 3 Drawing Sheets

62 µm

METHOD FOR BRAZING CERAMIC-CONTAINING BODIES, AND ARTICLES MADE THEREBY

CROSS-REFERENCE TO RELATED APPLICATIONS

This patent document claims the benefit of U.S. Provisional Application No. 60/523,857, filed on Nov. 20, 2003. The instant patent document furthermore is a Continuation-in-Part of U.S. patent application Ser. No. 10/294,454, filed on Nov. 14, 2002 now U.S. Pat. No. 6,884,511, which claims the benefit of U.S. Provisional Application No. 60/332,816, filed on Nov. 14, 2001. The entire disclosures of these commonly owned patent applications are hereby incorporated by reference.

BACKGROUND OF THE INVENTION

1. Field of the Invention

The instant invention relates to techniques for joining ceramic-containing materials to metal-containing or ceramic-containing materials. More specifically, the instant invention relates to joining ceramic bodies or metal-ceramic composite bodies to other bodies by means of brazing. Of particular interest are techniques to braze siliconized or reaction-bonded composite bodies such as reaction-bonded silicon carbide to ceramic bodies such as aluminum nitride, or to bulk silicon, particularly in the form of wafers or sheets.

2. Discussion of Related Art

U.S. Pat. No. 4,602,731 to Dockus discloses a direct liquid phase bonding of ceramics or carbides to metals or other ceramics that provides joints of high strength at a low temperature, and thereby not affecting the ceramic microstructure or mechanical properties. The technique utilizes an aluminum-silicon brazing sheet or aluminum filler metal, and plating a thin film of nickel, nickel-lead alloy or cobalt-lead alloy onto the brazing sheet. The plated brazing sheet is then placed between the metal and ceramic bodies to be bonded. A single firing at relatively low temperature (about 1100° F.-1200° F.) in an inert atmosphere or vacuum is sufficient to carry out the bonding. During the heating operation, the aluminum-silicon alloy reacts with nickel to form a ternary eutectic. The reaction liberates heat, which aids in the formation of the eutectic and promotes additional reactivity at the metal-liquid-ceramic interface. A shear strength of about 4500 psi (31 MPa) is reported.

U.S. Pat. No. 5,965,193 to Ning, et al. discloses a process for applying a metal layer to a ceramic body. In particular, the ceramic member is contacted to a melt of aluminum or aluminum-alloy, and moved relative to the melt, thereby producing a clean interface between the melt and the ceramic member so that the ceramic member is wetted by the melt. Upon cooling, the melt remains solidified on the surface of the ceramic member. An application of this technique is in production of electronic circuits. Specifically, a predetermined circuit pattern may be etched into the aluminum surface.

U.S. Pat. No. 6,033,787 to Nagase et al. discloses a ceramic circuit board with a heat sink that exhibits long life under heat cycles, and has improved heat dissipation. The novel ceramic circuit board is produced by laminating and bonding aluminum plates onto both sides of a $Si_3N_4$, AlN, or $Al_2O_3$ ceramic substrate using aluminum-silicon-based "brazing solders", and a heat sink formed of Al/SiC composite is laminated and bonded onto a surface of the first or second aluminum plate. The Al/SiC heat sink typically is also bonded to the aluminum plate with the brazing solder. In another embodiment, however, instead of using a brazing solder, the heat sink may be bonded to the rest of the structure by means of an aluminum foil featuring layers of aluminum alloy placed on both sides of the aluminum foil, the aluminum alloy having a lower melting point than the aluminum foil. Still further, nickel may be plated onto the bonding surfaces of the heat sink and the aluminum alloy layer, which enables the heat sink to be easily bonded to the aluminum foil.

One problem with employing nickel in conjunction with aluminum or aluminum-silicon-based brazing alloys is that of the reaction between the nickel and the aluminum or silicon to produce intermetallic compounds. Such compounds typically exhibit brittle behavior, at least at the temperatures of interest, e.g., about 0° C. to 100° C. The brittle nature of these intermetallics can result in weak metallurgical joints.

The Nagase technique nevertheless always requires that a metal plate, e.g., aluminum plate, be bonded to the ceramic substrate by means of the aluminum-silicon brazing solder. Further, in that embodiment in which the Al/SiC heat sink is bonded to an aluminum plate without the brazing solder, the aluminum foil had to be coated on both sides with the "aluminum-silicon melting point lowering layers."

The instant invention addresses these deficiencies.

In recent years, reaction-bonded silicon carbide ("RBSC") has become a candidate material for such applications as structural components of semiconductor fabrication equipment, wafer tables or chucks, for example. In these and in other applications in which this material increasingly is being used, there is a need to bond RBSC to other RBSC bodies. There is also a need to be able to bond RBSC to ceramic dielectrics such as aluminum nitride to provide for electrical insulation.

RBSC has also been suggested as a candidate mirror material. This material is difficult to polish to the exactness required of a mirror application because the SiC and the Si constituents have very different hardnesses and therefore are abraded at different rates. The SiC phase often ends up "standing proud" above the level of the Si areas. In contrast, Si can be polished readily to the required smoothness, but does not possess sufficient stiffness. Thus, unless they are made sufficiently thick, such mirrors could distort under their own weight. However, in an application such as a wafer table for a semiconductor lithography machine, or for a space-based mirror, the extra weight exacts a performance penalty. Thus, some workers have made the substrate or support for the mirror from RBSC, and then applied a silicon coating, such as by evaporation, to form the reflective surface. However, the physical deposition rates of the silicon are excruciatingly slow, and very little polishing can be done after the silicon surface is applied, lest the polishing wear through the thickness of the coating.

RBSC usually contains residual silicon, typically in interconnected form and dispersed throughout the silicon carbide phase. Another recent development has been the modification of this residual infiltrant phase to substitute one or more metals for some or all of the silicon, thereby imparting more metallic character to such modified or "hybrid" RBSC bodies, e.g., toughness. Like the Al/SiC composites of Nagase, the modified RBSC's of the instant invention contain SiC, Si and Al. In spite of these compositional similarities, a brazement could not be achieved by applying the braze directly to the modified RBSC material, at least not when the RBSC contains appreciable amounts of aluminum.

In contrast, the Al/SiC of Nagase was readily brazeable. Clearly, these metal-ceramic composites are not as similar as a mere comparison of chemical constituents might tend to imply. Among the differences noted by the instant inventors, however, is that Nagase teaches a Si content in the metal matrix phase of his Al/SiC composite only up to about 20 wt %, whereas the Si content of the metal matrix of the instant RBSC materials typically is higher, e.g., about 40 wt % Si or more. The use of chloride or fluoride-based fluxes helps in the RBSC bonding somewhat, but the bonding was still somewhat unreliable in the RBSC version containing 40% Si in the infiltrant phase, and at best yielded a shear strength of only about 20 MPa. Besides, for many of the applications contemplated by the instant invention, such as semiconductor fabrication, these fluxes are considered contaminants and their use is discouraged if not prohibited outright.

What is needed is a technique for metallurgically bonding ceramic-containing materials such as RBSC to metal-containing or ceramic-containing materials at relatively low temperature, reliably, and with high-strength, without the possibility of intermetallic formation and without the need to use halogen-based fluxes. It is also an object of the present invention to attach a surface layer of silicon to a rigid substrate such that the bonded silicon layer can then be polished, perhaps also including grinding before polishing, to make an optical quality mirror. The instant invention provides this solution.

SUMMARY OF THE INVENTION

According to the instant invention, a ceramic-containing body having clean bonding surfaces, such as one based on silicon carbide, is metallurgically bonded to a metal or metal-containing body, or to another ceramic-containing body by means of an aluminum-silicon based brazing alloy composition. Often times, no metallization step of either body to be bonded is required. In those instances in which metallization of a bonding surface is desirable, preferred metallization materials include substances that are substantially non-reactive with aluminum or silicon, such as metals consisting essentially of aluminum or silicon, or some alloy of the two. Particularly preferred are compositions near the aluminum-silicon eutectic composition. A preferred metallization technique is that of physical vapor deposition, e.g., evaporation or sputtering.

The form of the brazing alloy may be powder, paste, foil, etc. In any event, the brazing alloy is contacted to each bonding surface, and heated to a temperature sufficient to accomplish bonding. For all practical purposes, this temperature is at least as high as the liquidus temperature of the brazing alloy, but generally below the melting temperature of the substrate materials being bonded, and preferably also below the melting temperature of the aluminum or silicon-containing coatings. Such brazing does not require halogen-based fluxing agents. Further, the brazing can be carried out at intermediate temperatures, e.g., at a temperature above the final soldering temperature but below the melting point of aluminum. This technique has been found to be effective for brazing of RBSC bodies to each other, to monolithic ceramic or ceramic-metal composite bodies, or to metals. The technique has been found to be particularly effective for joining of RBSC bodies that have been modified in the residual silicon phase to incorporate one or more different metals, aluminum being particularly preferred. The resulting bonded structures have utility as mirrors, as packaging for electronics, and as components in semiconductor lithography equipment, e.g., as electrostatic chucks for supporting a silicon wafer during the lithography process.

Also significant is that the instant brazing system possesses a melting point below that of pure aluminum. Thus, the instant brazing system permits metal-containing composite bodies such as aluminum-based composites to be metallurgically bonded without adversely affecting the metal component of the composite, and at the same time permits subsequent soldering at lower temperature (e.g., around 410° C.), which represents the final metallurgical bonding operation.

The instant invention is particularly applicable to the brazing of ceramic-containing bodies containing interconnected silicon carbide, such as those produced by a reaction-forming process, e.g., "reaction-bonded silicon carbide". To make such composite bodies, a porous mass containing at least some reactable carbon is infiltrated with a molten infiltrant containing silicon. At least at some point during the infiltration, the silicon component of the infiltrant chemically reacts with at least a portion of the carbon in the porous mass to form silicon carbide. Typically, some infiltrant material remains in the infiltrated body, and distributed throughout. The body thus formed containing in-situ silicon carbide and residual infiltrant material is therefore a composite body. The infiltrant material may consist of essentially commercially pure silicon, or it may contain one or more other metallic constituents, such as aluminum. The above-mentioned technique should not be limited to the instant RBSC systems, but should also work with other reaction-bonding systems featuring fillers or reinforcements other than SiC. It should also work with other materials containing interconnected silicon carbide, such as siliconized silicon carbide, as well as other silicon carbide ceramics produced by hot pressing or sintering. It is expected also to work with reaction-formed silicon nitride.

DEFINITIONS

"Infiltrant", as used herein, refers to the source of silicon-containing metal or metal alloy used to infiltrate a porous mass or preform to produce a silicon-containing composite body. For purposes of this disclosure, elemental silicon is considered a metal.

"Infiltrant phase", as used herein, refers to the metal or metal alloy phase located within a reaction-bonded silicon carbide body.

"MMC", as used herein, means "Metal Matrix Composite".

"RBSC", as used herein, means "Reaction-Bonded Silicon Carbide".

"Reaction-Bonding", "Reaction-Forming", "Reactive Infiltration" or "Self-Bonded", as used herein, means the infiltration of a porous mass containing at least one substance in a form that is available to react with an infiltrant containing elemental silicon to produce a composite body containing at least some refractory compound of silicon produced in-situ.

"Residual infiltrant", as used herein, refers to that portion of the infiltrant that, following the infiltration process, is located within, and distributed throughout the composite body that is formed.

"Siliconizing", as used herein, means the infiltration of a porous mass with a molten infiltrant containing elemental silicon, at least the silicon constituent being substantially non-reactive with the constituents of the porous mass to produce a composite body having a matrix containing silicon.

DETAILED DESCRIPTION OF THE INVENTION AND PREFERRED EMBODIMENTS

Figure 1:
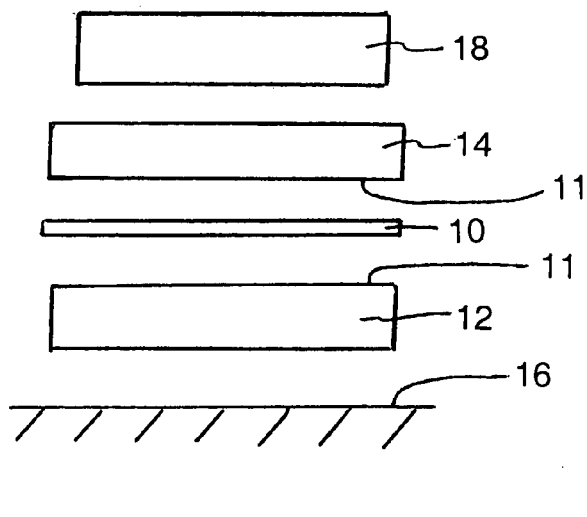
FIG. 1 shows a cross-sectional schematic view of an assembly of an RBSC body and an AlN body in preparation for brazing.

The instant invention addresses techniques for joining ceramic-containing materials to metal-containing or ceramic-containing materials. More specifically, the instant invention relates to joining ceramic bodies or metal-ceramic composite bodies such as reaction-bonded silicon carbide to other bodies such as silicon-based bodies, e.g., bulk silicon, by means of a technique that involves brazing.

According to a first aspect of the instant invention, the ceramic-containing body to be metallurgically bonded is first coated with a metal that is substantially non-reactive with aluminum or silicon, such as aluminum or silicon themselves. Desirable coating techniques include evaporation, sputtering and chemical vapor deposition. The applied metal layer is strongly bonded to the ceramic-containing substrate. Aluminum-silicon brazing alloys can then be used to bond such coated ceramic-containing bodies to themselves or to metal or metal-containing bodies reliably and with high strength. Such brazing does not require high temperatures and does not require the halogen-based fluxing agents. This technique has been found to be particularly effective for brazing of RBSC bodies to each other, to other ceramic or ceramic composites, or to metals or metal composites.

According to an alternate aspect of the instant invention, under certain conditions, the coating or metallization layer may be dispensed with, and the brazing material will wet and bond directly to the substrate body. The conditions under which this aspect can be realized occur, for example, when the substrate body is a silicon-containing composite body, e.g., siliconized SiC or a reaction-bonded composite body such as RBSC, and the residual infiltrant contains a certain minimum amount of elemental silicon. For instance, an RBSC composite body whose residual infiltrant component was an aluminum-silicon alloy containing about 78 percent by volume of silicon could be brazed without having to metallize the bonding surface of the substrate body.

Again, the advantages of the instant brazing technique include the realization of bonds having higher strength and reliability, the avoidance of systems that can yield brittle intermetallics, simpler processing at least in terms of the number of metals that one has to employ to the task at hand, and the fact that each step in the joining operation can be conducted at temperatures below 650° C. Bonds of high strength are important because reliability during service increases with increasing bond strength, as does resistance to thermal cycling fatigue. The ability to bond below a temperature of about 650° C. is significant because bonds can thereby be achieved without melting aluminum. This capability suggests that certain aluminum metal matrix composites might also be bonded using the instant technique, provided that the matrix does not have too low a melting point.

The temperature regime of the instant brazing compositions is also strategically positioned from another standpoint. In particular, when multiple brazing operations need to be conducted, which is often the case in fabricating electronic devices or their packages, the operations typically utilize braze or solder compositions having different melting points. The steps are then carried out in order from highest to lowest temperature, thereby ensuring that subsequent brazing operations do not melt previously brazed bonds. Cu—Sil is a popular high temperature braze, but it requires heating to at least about 800° C.; thus, it cannot be used to bond materials containing appreciable amounts of aluminum, such as aluminum matrix composites. The final or last metallurgical bonding operation typically is a soldering that occurs at about 410° C. using for example, a gold-silicon alloy. Thus, the joined assembly has a use temperature up to nearly the melting point of the lowest melting point solder, here, about 400° C. As mentioned above, the instant braze composition generally has a melting point below that of aluminum, thereby permitting its use in joining structures made of aluminum without adversely affecting, e.g., melting, the structure to be brazed. Still further, in those applications in which Cu—Sil can be used, the instant brazing composition would serve as an intermediate temperature braze, thereby permitting at least three brazing operations: Cu—Sil, the Al—Si braze of the instant invention, and then Au—Si.

To carry out the bonding techniques of the instant invention, the surfaces to be bonded are first cleaned to remove deleterious substances such as loosely held debris or organics. The typical technique here to perform this cleaning is by means of an ultrasonic bath in organic solvent, but other techniques such as grit blasting or dry ice blasting (e.g., blasting with bodies of frozen carbon dioxide) may also be effective.

Next, and where necessary or desirable, the bonding surfaces of one or both of the bodies to be joined may be coated with aluminum, silicon or an alloy thereof. The preferred technique is to deposit such a coating by physical vapor deposition, for example, evaporation or sputtering. Other techniques such as chemical vapor deposition or plating, e.g., electroplating, may also work well. Sputtering and plasma-enhanced chemical vapor deposition are particularly preferred. A coating thickness on the order of about 25 microns has proven to be entirely satisfactory, although the optimal coating thickness may vary depending upon the particulars of the application.

The brazing alloys of the instant invention are those that are based upon aluminum and silicon, and preferably consist essentially of aluminum and silicon. The specific alloy may be hypoeutectic or hypereutectic, but in any event is richer in aluminum than in silicon on an atomic percent basis. In a preferred embodiment, the instant invention utilizes a binary Al—Si alloy featuring about 5-15 weight percent silicon, balance aluminum. Again, one of the objectives of such a brazing composition is to provide a brazing material whose melting point or liquidus is less than the melting temperature of pure aluminum, which is about 660° C. Accordingly, brazing compositions of aluminum-silicon alloys whose liquidus temperature is between about 650° C. and the aluminum-silicon eutectic of about 577° C.-584° C. should be satisfactory. Of course, the eutectic temperature may be lowered still further (e.g., a ternary eutectic) by alloying with the appropriate metal, e.g., copper, silver, tin or zinc. On the other hand, where the bodies to be bonded do not contain aluminum, the brazing alloy may be a hypereutectic composition having a liquidus temperature above the melting point of pure aluminum, for example, at about 725° C.

The braze may be provided in any one of a number of common forms such as foils, pastes, powders, wires, rods, etc.

Fluxing agents, typically halogen (e.g., chlorides and fluorides) salts are commonly used in brazing and soldering to chemically clean the surfaces to be bonded, including chemically reducing surface oxides. The flux also operates as a sealant to prevent atmospheric oxygen from oxidizing or re-oxidizing the surfaces of the brazing/soldering material. Unfortunately, for some of the semiconductor handling applications envisioned by the materials of the present invention, such fluxes cannot be used in brazing these materials because the metals and halogen compounds are potential sources of chemical contamination of the silicon chips being processed by the machines that use the brazed bodies of the instant invention as components thereof. Accordingly, the instant joining system had to be developed without reliance on such fluxing agents.

As shown above in the Nagase Patent, at very high concentrations of aluminum in the matrix phase of the metal matrix composite ("MMC"), a brazement directly to the MMC could be achieved (although strength numbers were not reported). For the instant inventors' RBSC composite materials where the matrix phase compositions contained appreciable amounts of silicon added to the aluminum, the RBSC had to be coated with Al or Si, as discussed above. Accordingly, it was surprisingly discovered by the instant inventors that when the silicon content increased still further such that the matrix phase consisted predominantly of silicon, e.g., at least about 75 wt % Si, no coating layer was required on the composite body. For example, RBSC containing predominantly silicon in the residual metal phase could be directly brazed to another such body or to other silicon-containing bodies such as to bulk silicon metal using only the Al—Si brazing material, and not needing any metallization or coating of the bonding surfaces with aluminum or silicon. This result represents another aspect of the instant invention. The following table summarizes the overall results.

TABLE 1

| Material | Reinforcement SiC (vol %) | Matrix Al (vol %) | Comp. Si (vol %) | Strength, MPa |
|---|---|---|---|---|
| Al/SiC of Nagase Patent | unknown, but likely about 40-50 | 80-95 | 5-20 | unknown, but high |
| HSC-701 | 70 | 60 | 40 | 0 |
| HSC-703 | 70 | 22 | 78 | 35 |
| SSC-702 | 70 | 0 | 100 | 45 |

As will be seen in some of the Examples to follow, RBSC whose metal phase is rich in silicon was successfully brazed to bulk silicon metal. The silicon metal was generally in the form of sheets or plates, and in some instances consisted of single crystal silicon. No prior metallization was required of either bonding surface. This result is significant because it provides a low-cost method for providing a silicon surface on a substrate. Especially significant is that by brazing bulk silicon bodies to a substrate, instead of depositing silicon coatings, a relatively thick silicon surface can be provided in a short time. A relatively thick layer is significant because the thickness can then provide sufficient stock for grinding and polishing to make a reflecting surface such as a mirror.

As will also be seen in some of the Examples to follow, RBSC materials, regardless of whether or not the Si matrix has been modified compositionally with aluminum, have been successfully bonded to aluminum nitride ceramic material with high bonding strength, and without cracking either substrate. This result is particularly significant because such a brazed structure will find great utility in the semiconductor equipment industry as an electrostatic chuck for supporting and fixing in place a silicon wafer during processing, e.g., lithography. Without wishing to be bound to any particular explanation, it may be that the instant RBSC materials are sufficiently closely matched in terms of thermal expansion coefficient (CTE) to that of AlN that any thermal stress generated during cool-down from the bonding temperature is minimal. Where a metallurgical bond is involved, matching the CTE's of the bodies being bonded usually is of high importance. For example, certain forms of RBSC such as HSC-703 (M Cubed Technologies, Inc., Monroe, Conn.) could be brazed to aluminum oxide according to the instant techniques, but upon cooling following the brazing operation, the aluminum oxide body cracked. The instant HSC-703 composite materials have CTE's in the range of about 4-5 ppm/K, and thus even brittle ceramics having CTE close to this range, e.g., silicon carbide, should be brazeable and not present a cracking problem. Ductile materials such as most metals should not pose a similar problem, and it is expected that the techniques of the instant invention can be used to braze ceramic-containing materials such as RBSC to aluminum.

Although the instant brazing technique was developed with an eye toward bonding aluminum-containing RBSC bodies, the technique should be applicable to other ceramic-containing materials as evidenced by the fact that it has been used successfully to bond aluminum nitride to RBSC. It should be possible, for example, to braze silicon carbide bodies using Al—Si brazing alloys by coating or metallizing the SiC bonding surface with Al or Si. It should be possible to braze other reaction-bonded composite bodies such as reaction-bonded silicon nitride or reaction-bonded boron carbide.

It may be possible to metallurgically bond metal matrix composites (MMC's) such as those based on copper as the matrix due to the higher melting point of copper relative to the brazing temperatures of the instant Al—Si brazing alloys. It may even be possible to bond certain aluminum-based metal matrix composites using the instant brazing technique. For example, MMC's whose matrix phase is nearly 100 percent aluminum should be brazeable without melting the matrix phase. Further, it may be possible that a small or localized amount of melting in an aluminum MMC might be tolerated without destroying the structural or shape integrity of the MMC. If so, aluminum-based MMC's containing large volume fractions of discontinuous reinforcement, or MMC's containing a continuous reinforcement phase, perhaps even just a thin ceramic skeleton in addition to a discontinuous reinforcement phase, may be brazeable without losing structural or shape fidelity.

Due to its high thermal conductivity and low CTE, among other reasons, the instant invention has been found to be particularly useful in joining reaction-bonded silicon carbide to itself and to other ceramic-containing or metal-containing materials.

By way of review of the fundamental reaction-bonding process as used in connection with the production of silicon carbide composite bodies, a porous mass containing at least some carbon is infiltrated with a molten infiltrant containing silicon, preferably in a vacuum or inert gas atmosphere. At least at some point during the infiltration, the silicon component of the infiltrant chemically reacts with at least a portion of the carbon in the porous mass to form silicon carbide. Typically, some infiltrant material remains in the infiltrated body, and distributed throughout. The body thus formed containing in-situ silicon carbide and residual infiltrant material is therefore a composite body.

Recently, it has become known to alloy the infiltrant metal used to make a reaction-formed silicon carbide body so that the metal phase of the formed body includes a constituent other than silicon. For example, the infiltrant may contain an alloy of silicon and aluminum to yield a phase in the formed silicon carbide body containing metallic aluminum or aluminum plus silicon. Such bodies containing an alloyed infiltrant advantageously permit certain properties of the body to be tailored to meet specific needs. For example, by replacing some of the residual silicon infiltrant with aluminum, the coefficient of thermal expansion, the thermal conductivity and the fracture toughness of the composite body each may be increased.

In a preferred embodiment, the porous mass or preform contains one or more substantially inert filler materials. By this is meant a filler material that is substantially non-reactive with the molten infiltrant under the particular processing conditions. Sometimes referred to as the "reinforcement" phase of a composite material, the filler can serve a number of useful functions. For example, the physical properties of the composite body can be tailored or adjusted to reflect some proportion of those of the filler material component. One such filler material that is especially preferred is silicon carbide, as molten silicon more easily wets silicon carbide than other inert materials, such as oxides. For reasons of economy and availability, particulate is commonly used.

Although it is possible to make silicon carbide composite bodies by a siliconizing process, e.g., by infiltrating molten silicon into a porous mass containing silicon carbide and substantially no reactable carbon (e.g., "free carbon"), the instant inventors prefer to conduct a true reaction bonding process by reacting the silicon component of the infiltrant with some free carbon provided within the porous mass. Still, the instant inventors prefer to limit the amount of free carbon in the porous mass to no more than about 10 percent by weight, and more preferably no more than about 5 percent. In a preferred embodiment, the carbon is introduced to the porous mass as a resin. This mixture may then be molded to the desired shape. Curing the resin renders the porous mass self-supporting, e.g., as a preform. During subsequent thermal processing, or during an intervening firing step, typically in a non-oxidizing atmosphere, the resin pyrolyzes to carbon in interconnected form to yield a preform containing at least about 1 percent by volume of carbon.

Again, the advantages of the instant brazing technique include the realization of bonds having higher strength and reliability, the avoidance of systems that can yield brittle intermetallics, simpler processing at least in terms of the number of metals that one has to use, and the fact that each step in the joining operation can be conducted at temperatures below the melting point of aluminum. If the substrates to be bonded contain no appreciable amounts of aluminum, the instant braze composition can represent the middle temperature regime in a three-way brazing system involving Cu—Sil as the high temperature braze and Au—Si alloys as the 410° C. solder.

The invention will be further illustrated by the following non-limiting examples.

Table 2 sets forth the chemical composition of three reaction-bonded SiC composite materials that were braze bonded in the Examples below (except for Examples 4 and 5).

TABLE 2

| Material | SiC (vol %) | Al (vol %) | Si (vol %) |
|---|---|---|---|
| HSC-701 | 70 | 17 | 13 |
| HSC-703 | 70 | 6.6 | 23.4 |
| SSC-702 | 70 | 0 | 30 |

Pre-Brazing Procedure

Some of these Examples to follow describe substrates for brazing that feature a metallization layer that is deposited prior to brazing. This section describes the treatment of these substrates just prior to the brazing operation.

The two pieces of the ceramic-containing material to be joined to one another were ground on the bonding surfaces to a surface finish of about 0.30 micron average. Then, the surfaces to be brazed were cleaned by wiping with acetone. Then, those surfaces were coated with either aluminum or silicon to a thickness of about 25 micrometers by Surmet Corp., of Burlington, Mass. Aluminum was deposited by a magnetron sputtering process, while silicon was applied using plasma enhanced chemical vapor deposition (PECVD).

Brazing Procedure

A braze foil (Grade AL718, Handy and Harmon, Cudahy, Wis.) having a thickness of about 25 micrometers and containing by weight about 88 percent Al, balance Si, was cut to the same length and width dimensions as the bodies to be brazed. All surfaces that were to participate in the joining were cleaned with isopropanol.

Referring to FIG. 1, one foil was placed between the surfaces of the bodies 12, 14 to be joined to form an assembly. The assembly was placed onto a graphite container 16, and held in place with a 1250 gram steel plate 18 being placed on top of the assembly.

The graphite container and contents was placed into a vacuum furnace. The chamber was closed, and then the atmosphere in the chamber was evacuated using a mechanical roughing pump. When the pressure inside the chamber had equilibrated at less than about 50 micrometers, the heating elements were energized and the chamber and its contents were heated to a temperature of about 500° C. at a rate of about 10° C. per minute. After maintaining a temperature of about 500° C. for about 1 hour, the chamber and its contents were further heated to about 620° C. at a rate of about 10° C. per minute. After maintaining a temperature of about 620° C. for about 1 hour, the chamber and its contents were cooled at a rate of about 5° C. per minute. When the temperature had dropped to almost ambient (20° C.), the pressure in the chamber was let back up to ambient, the chamber was opened, and the assembly was recovered.

EXAMPLE 1

This example demonstrates that a sheet or plate of silicon metal may be brazed to a RBSC substrate.

Specifically, a Grade SSC-702 RBSC plate and a silicon metal plate were cleaned with isopropanol and brazed to one another in accordance with the above-described brazing procedure. No metallization was applied to either bonding surface; they were left uncoated.

The brazed assembly was then ground and polished on the silicon surface using techniques well known in the art to produce a silicon-surfaced mirror. The roughness of the resultant surface is under few nanometers and the surface flatness can be of the order of fraction of a wave (where the wavelength is 630 nm).

EXAMPLE 2

This example demonstrates another embodiment of brazing a sheet or plate of silicon metal to a RBSC substrate.

Specifically, a Grade HSC-703 reaction-bonded silicon carbide plate was cleaned with acetone. The RBSC plate was then metallized with aluminum. Specifically, aluminum was deposited by a magnetron sputtering process to a thickness of about 25 microns. The silicon metal plate was not coated with aluminum; it was left uncoated. Finally, the Brazing Procedure as described above was conducted, thereby bonding the RBSC and silicon plates to one another.

EXAMPLE 3

This example demonstrates the efficacy of brazing single crystal silicon to a ceramic composite substrate using the instant techniques. The materials and procedures were substantially the same as in Example 1 except as noted below.

The bulk silicon was standard polished single crystal silicon measuring about 2.75 inches long by about 2.5 inches wide by about 0.029 inch thick. The substrate was Grade SSC-702 reaction bonded silicon carbide (M Cubed Technologies) in a ground condition and measuring about 4 inches square by about 0.5 inch thick. The pressure applied by the 1250 gram tool steel dead load was about 0.68 psi.

Figure 4:
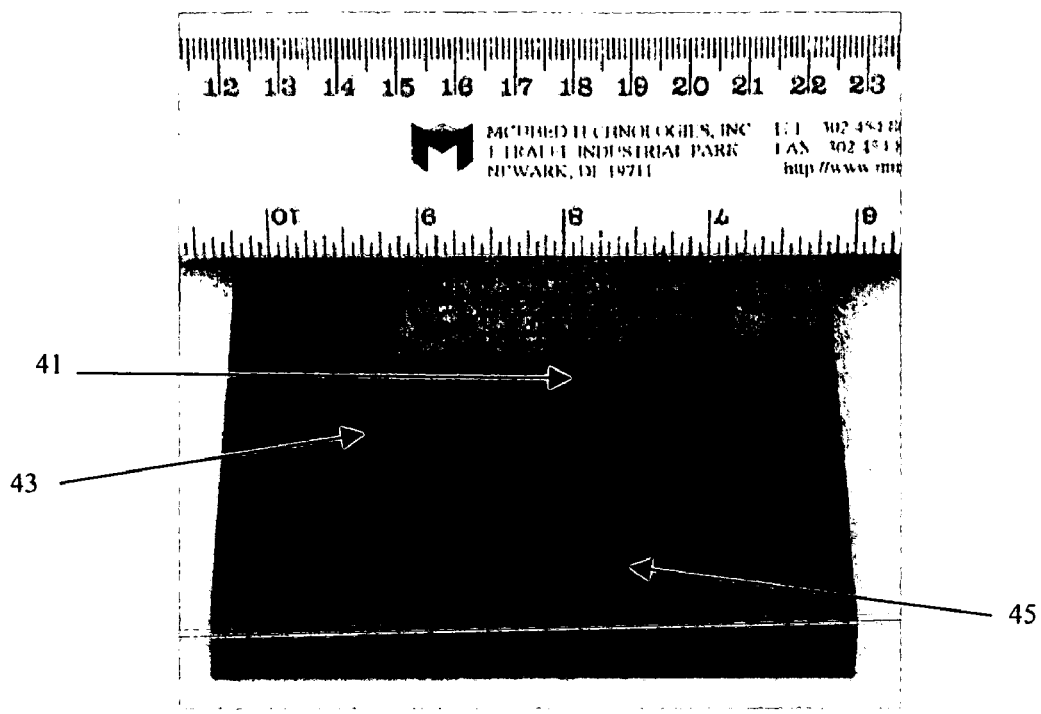
FIG. 4 is a front (silicon on top) view of specimen in Example 3 (silicon-to-RBSC brazed joint). The RBSC composite substrate is observable in some areas not covered by silicon.
Figure 5:
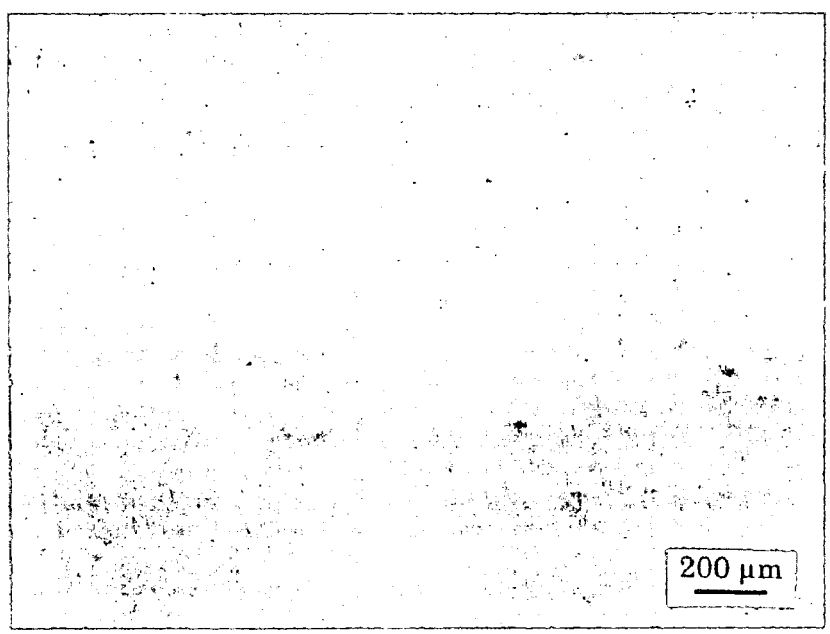
FIG. 5 is a micrograph of the surface of the silicon wafer brazed to the RBSC composite in Example 3.

Upon cooling following thermal processing, the polished single crystal silicon wafer was found to be strongly bonded to the RBSC substrate. No macroscopic cracking was observed. FIG. 4 is a perspective view photograph of the brazement, and it shows the polished silicon wafer 41, some exposed portions of the braze material 43, and some exposed portions of the RBSC composite substrate. Microscopic inspection of the polished silicon surface showed no microcracking, either. See FIG. 5. This is due to the excellent match between the silicon wafer and the RBSC substrate.

EXAMPLE 4

The materials and methods of this example were substantially the same as Example 3 except that the substrate consisted of reaction bonded silicon carbide having a carbon fiber reinforcement, and was of a different size. The carbon fibers were unidirectional.

Figure 6:
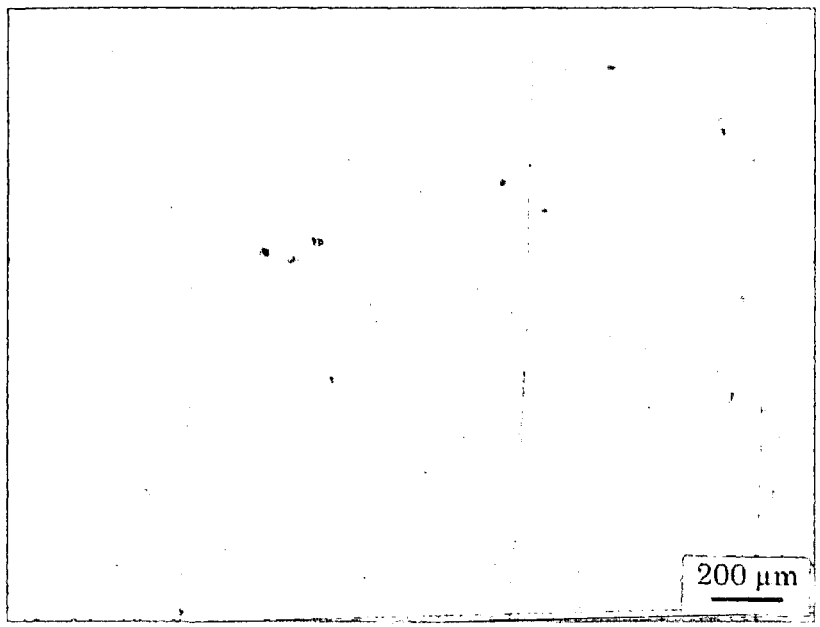
FIG. 6 is a micrograph of the surface of the silicon wafer brazed to a RBSC composite reinforced with unidirectional carbon fibers as described in Example 4.

Upon cooling following thermal processing, the single crystal silicon wafer was observed to be strongly bonded to the substrate. However, the polished silicon wafer featured multiple equally spaced, parallel cracks running perpendicular to the axial direction of the fibers. See FIG. 6, which is a micrograph of the surface of the brazed silicon wafer. The cracking probably is due to a strong brazement and CTE mismatch: Si has a CTE of about 2.3 ppm; the carbon fiber-reinforced RBSC substrate has a CTE of about 1.0 in the fiber axis direction.

This Example thus shows that the brazement bond that was formed is stronger than the tensile strength of silicon.

For purposes of completeness, the rest of this example shows how the carbon fiber reinforced RBSC substrate body was made.

A prepreg consisting of aligned Mitsubishi K13710 carbon fibers embedded in a RS-11 epoxy matrix was obtained from YLA, Inc. (Benicia, Calif.).

Pieces measuring about 2 inches (51 mm) square were cut from the prepreg at 0, 45 and 90 degree angles with respect to the fiber direction. The pieces were then stacked atop one another in the following order to make a quasi-isotropic laminate: 0, 90, ±45, −4, ±45, 90, 0 degrees orientation. While stacking the pieces, about 0.25 gram of Mitsubishi pitch (Grade AR) in powder form was spread onto each piece. The laminate was then heated in an air atmosphere oven under a slight uniaxial pressure (provided by a graphite cube measuring about 2 inches (51 mm) on a side) to melt the pitch. The heating was at 50 C per hour to a temperature of about 250 C, holding at about 250 C for about one hour, further heating to a temperature of about 340 C at a rate of about 50 C per hour, holding at about 340 C for about one hour, and then cooling at a rate of about 50 C per hour.

The laminate was then pyrolyzed in vacuum, specifically by heating to a temperature of about 900 C at a rate of about 100 C per hour, maintaining a temperature of about 900 C for about one hour, and then cooling at a rate of about 200 C per hour. The pyrolyzed laminate measured about 2 inches (51 mm) square by about 0.04 inch (1.0 mm) thick.

To carry out the reactive infiltration, about 2.4 grams of silicon metal in lump form (Elkem Metals, Inc.) was placed on top of the pyrolyzed laminate, which was then placed into a boron nitride coated graphite mold, which in turn was placed into a graphite chamber sufficiently non-hermetic so as to provide for atmosphere exchange. The graphite chamber and its contents were then placed into a vacuum furnace, which was then sealed, evacuated, and then energized. The contents of the graphite chamber were then heated to a temperature of about 1350 C at a rate of about 100 C per hour, maintained at a temperature of about 1350 C for about one hour, further heated to a temperature of about 1425 C at a rate of about 50 C per hour, maintained at a temperature of about 1425 C for about 15 minutes, and then cooled at a rate of about 200 C per hour.

Upon recovery from the furnace, the infiltrated laminate was found to contain about 50-55 vol % C fibers, about 8-10% SiC, and about 35-40% residual Si phase.

EXAMPLE 5

The materials and methods of this example were substantially the same as Example 4 except that, instead of uniaxial carbon fibers, the carbon fibers were woven in an orthogonal arrangement to form a two-dimensional ply. A number of such plies were then stacked atop one another until the desired thickness was achieved.

Figure 7:
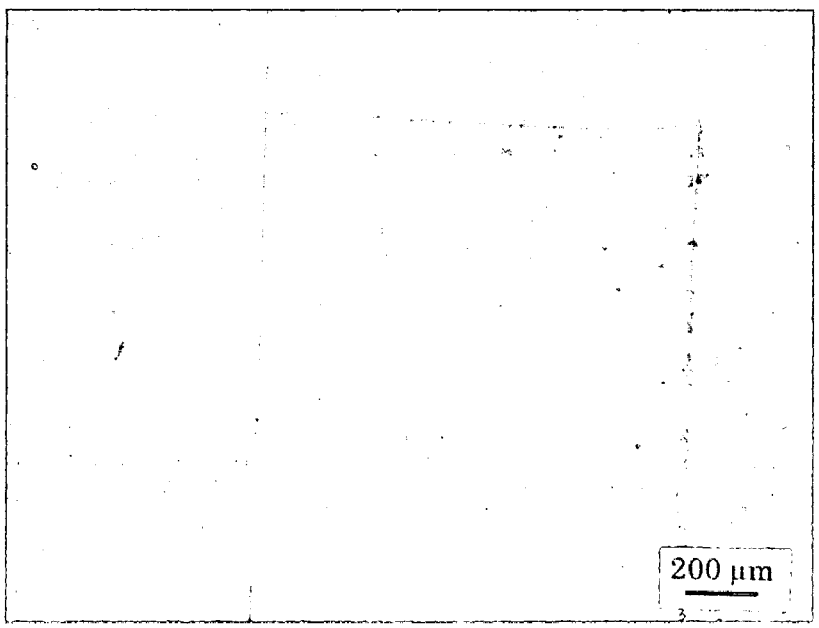
FIG. 7 is a micrograph of the surface of silicon wafer brazed to a RBSC composite reinforced with woven carbon fibers as described in Example 5.

Upon cooling following thermal processing, the single crystal silicon wafer was observed to be strongly bonded to the substrate. However, the polished silicon wafer featured multiple cracks. The cracks were equally spaced and orthogonal to one another. See FIG. 7, which is a micrograph of the surface of the brazed silicon wafer. The cracking probably is due to a strong brazement and CTE mismatch between the silicon wafer and the carbon fiber-reinforced RBSC substrate.

Thus, the brazement strength was again stronger than the tensile strength of the single crystal silicon.

The differential CTE-induced cracking phenomenon can be solved by using techniques such as functionally gradient compositions, or interposing one or more materials, generally provided in layer form, between the substrate and the silicon metal layer to accommodate the CTE mismatch. This latter technique can be accomplished by the interposed material having a CTE intermediate those of the silicon and the substrate, such as a very high stiffness intermediate CTE layer, or by having sufficient ductility to yield in response to the thermally induced stress, e.g., a compliant layer.

The balance of this example again explains in detail how the woven carbon fiber reinforced RBSC substrate body was prepared.

A carbon/carbon composite (CCAT, Ft. Worth, Tex.) consisting of a plurality of layers of Grade T-300 (BP Amoco Polymers, Alpharetta, Ga.) carbon fiber cloths in a phenolic resin (Grade SC-1008, Borden Chemical, Louisville, Ky.) was pyrolyzed in a non-oxidizing atmosphere at a temperature of about 900 C to produce a zero-stage composite body. The zero-stage body typically contains about 35-50 volume percent fibers, about 20-30 percent carbon matrix and about 20-30 percent porosity, and is typically about 0.155 inch (3.9 mm) thick.

A two inch (51 mm) square piece of the zero-stage composite material was placed flat (horizontally) in a BN coated graphite crucible contained within a graphite chamber. About 15 grams of silicon metal in lump form (Elkem Metals, Inc.) was placed on top of the square surface of the zero-stage body. The composite material was then thermally processed in substantially the same manner as the material in Example 4. As a result of this processing, the silicon melted and reactively infiltrated the carbon-carbon composite body to produce a more complex composite body having a matrix containing silicon and silicon carbide. The microstructure specifically consists of carbon fibers dispersed in a matrix consisting of some SiC formed in-situ (e.g., from reaction of molten silicon with carbon from the phenolic resin), residual, unreacted silicon, and some residual, unreacted carbon.

The composite body featuring the T-300 carbon fibers contained about 50-55 vol % C fibers, about 30-40% SiC and about 10-15% residual Si-bearing phase.

In the remaining Examples, the RBSC substrate is bonded to other ceramic-containing materials, such as other RBSC materials or other ceramic composites or bulk ceramics. Some of the resulting brazements were strength-tested, so it is appropriate to discuss this testing procedure.

Shear Test Procedure

Figure 2:
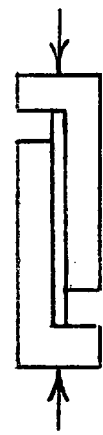
FIG. 2 illustrates the double-notch beam shear test.

The shear strength was measured by machining double notch test specimens having a geometry approximately as shown in FIG. 2, and with the notches extending all the way to the bond line. The specimens were loaded in compression as indicated by the arrows to induce a pure shear load in the shear area. The specimens were loaded to failure.

EXAMPLE 6

This example demonstrates, among other things, the brazing of two aluminum-containing RBSC plates to one another, and the measurement of the strength of the resulting brazement.

In this example, both members were Grade HSC-701 RBSC composite material (M Cubed Technologies, Inc., Monroe, Conn.) whose metal phase contained about 60 percent by weight of aluminum, balance silicon. The bonding surfaces were metallized with aluminum. The above-identified brazing procedure successfully bonded the pieces to one another. The calculated shear stress at failure was about 103 MPa.

COMPARATIVE EXAMPLE

Example 6 was repeated, except that no aluminum films were deposited on the bonding surfaces of the RBSC bodies. The attempt to braze the plates together using the Al—Si brazing foil resulted in no bond being formed, and the assembly fell apart from mere routine handling.

EXAMPLE 7

This example further demonstrates the brazing of two aluminum-containing RBSC bodies to one another. In this example, both members were Grade HSC-703 RBSC composite material (M Cubed Technologies, Inc., Monroe, Conn.), whose metal phase contained about 22 percent by weight of aluminum, balance silicon. As in Example 6, the coating on the bonding surfaces was aluminum. The brazing procedure was successful in bonding the bodies together. The calculated shear stress at failure was about 93 MPa.

EXAMPLE 8

Example 7 was repeated, except that no metallization coating was applied. Unlike the Comparative Example, where no bond resulted, here the RBSC bodies were successfully brazed according to the above-mentioned brazing procedure, with a resulting shear strength of about 35 MPa.

EXAMPLE 9

Example 8 was repeated, except the RBSC bodies to be joined were Grade SSC-702 (M Cubed Technologies, Inc., Monroe, Conn.) whose metal phase consisted essentially of silicon. The brazing procedure yielded a brazement, and the bonded bodies finally failed at an applied shear stress of about 45 MPa.

EXAMPLE 10

This example demonstrates the efficacy of using a silicon coating.

Example 7 was substantially repeated, except that instead of an aluminum coating, the bonding surfaces of the Grade HSC-703 RBSC composite material (M Cubed Technologies, Inc., Monroe, Conn.) were metallized with silicon. Specifically, a silicon film was deposited by plasma enhanced chemical vapor deposition (Surmet Corp., Burlington, Mass.). Brazing according to the above-identified brazing procedure was successful. The calculated shear stress at failure was about 30 MPa.

EXAMPLE 11

This example demonstrates the brazing of an aluminum nitride body to a RBSC body using the techniques of the instant invention, and refers again to FIG. 1.

Figure 3:
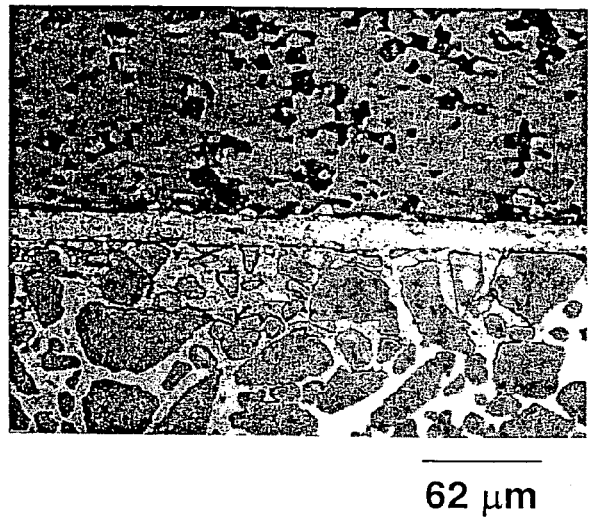
FIG. 3 is an optical photomicrograph of a cross-section of the brazement produced in accordance with Example 11.

Example 7 was repeated, except that an aluminum nitride (AlN) tile was substituted for one of the RBSC tiles. The AlN tile had about the same dimensions as the RBSC tile, and was procured from Sienna Technologies, Inc. (Grade ST AlN-170, Woodinville, Wash.). The AlN tile was similarly sputter coated with aluminum, and similarly oriented during brazing with the metallized surface 11 contacting the brazing material. Brazing was successful, and a polished cross-section of the brazed assembly is shown in FIG. 3. Specifically, this figure shows brazing alloy 30 metallurgically bonded to the RBSC body 32 and to the AlN body 34.

The shear stress to cause failure was found to be between about 73 and 86 MPa.

The following Table 3 summarizes the shear strengths obtained according to the techniques of the instant invention.

TABLE 3

| Member A | Member B | Coating | Shear Strength, MPa |
|---|---|---|---|
| HSC-701 | HSC-701 | none | no bond |
| HSC-701 | HSC-701 | Al | 102.6 |
| HSC-703 | HSC-703 | none | no bond |
| HSC-703 | HSC-703 | Al | 92.9 |
| HSC-703 | HSC-703 | Si | 29.6 |
| SSC-702 | SSC-702 | none | 81.7 |
| SSC-702 | SSC-702 | Al | 67.8 |
| HSC-701 | AlN | none | no bond |
| HSC-701 | AlN | Al | 63.0 |
| HSC-703 | AlN | none | no bond |
| HSC-703 | AlN | Al | 79.6 |
| HSC-703 | AlN | Si | 16.0 |
| SSC-702 | AlN | Al | 61.1 |
| SSC-702 | AlN | Si | 16.0 |

Thus, this Example demonstrates that aluminum-containing RBSC bodies can be metallurgically bonded to one another and to ceramics such as aluminum nitride in a reliable manner and with reasonable strength without having to employ fluxing agents to assist in the brazing operation. This Example shows successful brazements using both aluminum and silicon metallization layers on the aluminum-containing RBSC bodies and aluminum nitride bodies. The brazed bodies featuring the aluminum metallization in particular demonstrated shear strengths in excess of 60 MPa. Further, RBSC bodies not containing an aluminum constituent can be brazed with high strength without the need for a metallization layer.

The inventors note that the above-described Brazing Procedure utilizes an aluminum-silicon alloy of approximately eutectic composition. They note that, at least in the case of bonding ceramics or silicon metal to RBSC bodies, and particularly to RBSC bodies whose metal phase consists essentially of silicon, higher melting point braze compositions may be used, e.g., hypereutectic compositions. These brazing compositions containing larger amounts of silicon should also exhibit lower thermal expansion coefficients than the eutectic compositions, thereby presenting less CTE mismatch to the bodies being brazed.

INDUSTRIAL APPLICABILITY

The techniques of the instant invention will find application in those areas where a ceramic-containing body such as a monolithic ceramic body or a metal-ceramic composite body needs to be bonded to another body containing metal and/or ceramic and where the brazement possesses at least one of high thermal conductivity, a low thermal expansion coefficient, and intermediate melting temperature. These application areas include mirrors, electronic packaging, and semiconductor lithography equipment. The operating temperature of the instant brazing system, being below the melting point of aluminum but greater than typical soldering temperatures, makes this brazing system useful for brazing aluminum-containing materials such as Al/SiC or aluminum-modified RBSC. The instant brazing system avoids intermetallic formation, with its accompanying thermal conductivity and brittleness (structural reliability) issues. The instant brazing system does not require halogen-based fluxes, whose use might be prohibited in semiconductor wafer handling applications, e.g., chucks. Among the specific application areas is that of joining a readily polishable material such as elemental silicon to a substrate containing reaction-bonded silicon carbide to make, for example, a high quality optical reflecting surface, e.g., a precision mirror which could be used in semiconductor lithography or telescope applications, etc.

Those reasonably skilled in the art will readily appreciate that numerous modifications may be made to the techniques disclosed herein without departing from the scope of the invention, as defined in the claims to follow.

What is claimed is:

1. A mirror comprising:
(a) a substrate body made by a reaction-bonding process and having at least one bonding surface and comprising a composite material comprising at least one reinforcement component and a residual infiltrant component comprising silicon metal;
(b) at least one silicon metal body having at least one bonding surface and at least one reflecting surface that is ground and polished to a desired shape and surface finish; and
(c) an aluminum-silicon brazing alloy disposed between opposing bonding surfaces, and metallurgically bonded to each.

2. The mirror of claim 1, wherein at least a portion of said bonding surface of said reaction-bonded body is metallized, the metallized portion comprising at least one of aluminum and silicon.

3. The mirror of claim 1, wherein said bonding surface of said substrate body is not metallized.

4. The mirror of claim 1, wherein said brazing alloy comprises a hypereutectic composition.

5. The mirror of claim 1, wherein said residual infiltrant component comprises substantially 100 percent silicon metal.

6. The mirror of claim 1, wherein said composite material is a reaction-bonded body.

7. The mirror of claim 6, wherein said composite material is reaction-bonded silicon carbide.

8. The mirror of claim 1, wherein said composite material is siliconized silicon carbide.

9. An assembly of brazed bodies, the assembly comprising:
(a) a composite body having at least one bonding surface and comprising at least one reinforcement component and a residual metal component, said residual metal component containing at least about 75 percent by weight of silicon;
(b) at least one silicon metal body having at least one bonding surface that opposes at least one bonding surface of said composite body; and
(c) an aluminum-silicon brazing alloy disposed between opposing bonding surfaces, and bonded to each.

10. The assembly of claim 9, wherein at least a portion of a bonding surface of said composite body is metallized, the metallized bonding surface portion comprising at least one of aluminum and silicon.

11. The assembly of claim 9, wherein said bonding surface of said composite body is not metallized.

12. The assembly of claim 9, wherein said brazing alloy comprises a hypereutectic composition.

13. The assembly of claim 9, wherein said residual metal component comprises substantially 100 percent silicon.

14. A mirror comprising:
  (a) a reaction-bonded substrate body having at least one bonding surface;
  (b) at least one silicon metal body having at least one bonding surface and at least one reflecting surface that is ground and polished to a desired shape and surface finish; and
  (c) an aluminum-silicon brazing alloy disposed between opposing bonding surfaces, and metallurgically bonded to each bonding surface.

* * * * *